US011038341B2

(12) United States Patent
Nakashima et al.

(10) Patent No.: US 11,038,341 B2
(45) Date of Patent: Jun. 15, 2021

(54) LOAD DRIVING DEVICE

(71) Applicant: Rohm Co., Ltd., Kyoto (JP)

(72) Inventors: Takayuki Nakashima, Kyoto (JP); Yohei Okuno, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 98 days.

(21) Appl. No.: 16/493,405

(22) PCT Filed: Mar. 29, 2018

(86) PCT No.: PCT/JP2018/013459
§ 371 (c)(1),
(2) Date: Sep. 12, 2019

(87) PCT Pub. No.: WO2018/181815
PCT Pub. Date: Oct. 4, 2018

(65) Prior Publication Data
US 2020/0014194 A1    Jan. 9, 2020

(30) Foreign Application Priority Data

Mar. 29, 2017 (JP) .............................. JP2017-065118

(51) Int. Cl.
*H02H 7/122* (2006.01)
*B60L 50/52* (2019.01)
(Continued)

(52) U.S. Cl.
CPC ........... *H02H 7/1227* (2013.01); *B60L 50/52* (2019.02); *H02P 29/027* (2013.01); *H03K 17/08* (2013.01)

(58) Field of Classification Search
CPC ..... H02H 7/1227; B60L 50/52; H02P 29/027; H03K 17/08
See application file for complete search history.

(56) References Cited

U.S. PATENT DOCUMENTS

2009/0146629 A1* 6/2009 Kim ................. H02M 3/156
323/282
2011/0101878 A1* 5/2011 Huber ................. H05B 47/17
315/224
(Continued)

FOREIGN PATENT DOCUMENTS

DE    102010064258       7/2011
JP    2006-320177 A     11/2006
(Continued)

OTHER PUBLICATIONS

Japan Patent Office, International Search Report for PCT/JP2018/013459, dated Jul. 3, 2018.

*Primary Examiner* — Zoheb S Imtiaz
(74) *Attorney, Agent, or Firm* — Fish & Richardson P.C.

(57) ABSTRACT

A load driving device, wherein a logic portion for switching on/off a switch element connected to a load includes: a switch signal generation circuit for generating a switch signal so that the switch element is left on by default in a time duration from when power is turned on until an external reset release is performed by a microcomputer; an overcurrent protection circuit for performing, after the external reset release, an output restriction of the switch signal so as to forcibly switch the switch element off in response to an overcurrent detection signal; and a latch circuit for performing, in the time duration from when power is turned on until the external reset release is performed by the microcomputer, an output restriction of the switch signal so as to forcibly switch the switch element off with the overcurrent detection signal serving as a latch trigger.

10 Claims, 10 Drawing Sheets

(51) Int. Cl.
*H02P 29/024* (2016.01)
*H03K 17/08* (2006.01)

(56) References Cited

U.S. PATENT DOCUMENTS

| | | |
|---|---|---|
| 2011/0157756 A1 | 6/2011 | Zanardi et al. |
| 2012/0032660 A1 | 2/2012 | Nakamura |
| 2013/0055052 A1 | 2/2013 | Kaeriyama |
| 2014/0325322 A1 | 10/2014 | Kaeriyama |
| 2015/0138680 A1 | 5/2015 | Souma |

FOREIGN PATENT DOCUMENTS

| | | |
|---|---|---|
| JP | 2012-039761 A | 2/2012 |
| JP | 2013-051547 A | 3/2013 |

* cited by examiner

FIG. 2

| MODE | FWD | REV | BRK | IDL |
|---|---|---|---|---|
| G1 | ON | OFF | OFF | OFF |
| G2 | OFF | ON | OFF | OFF |
| G3 | OFF | ON | ON | OFF |
| G4 | ON | OFF | ON | OFF |

LOAD DRIVING DEVICE

TECHNICAL FIELD

The present invention relates to a load driving device.

BACKGROUND ART

Conventionally, a load driving device, which drives a load by turning on/off a switch element is provided with a function of forcibly turning off the switch element when an overcurrent flows through the switch element (=overcurrent protection function).

An example of the conventional technology related to this is disclosed in Patent Document 1 below.

CITATION LIST

Patent Documents

Patent Document 1: Japanese Patent Application Publication No. 2012-039761

SUMMARY OF THE INVENTION

Technical Problem

However, conventional load driving devices suffer a disadvantage that the overcurrent protection function is inactive in a reset period, which is immediately after power is turned on. Thus, when applied to where it is necessary to maintain a switch element in an on state in the reset period, the conventional load driving devices still have a room for improvement in safety.

The invention disclosed herein has been made in view of the above-mentioned problem found by the inventors of the invention, and an object thereof is to provide a load driving device that is capable of performing overcurrent protection operation even in the reset period.

Solution to Problem

According to an aspect of the present disclosure, a load driving device includes a driver portion including a switch element connected to a load, a logic portion configured to turn on/off the switch element, and an overcurrent detection portion configured to monitor a current flowing through the switch element and generate an overcurrent detection signal. Here, the logic portion includes a switch signal generation circuit configured to generate a switch signal so as to maintain the switch element in an on state by default from when power is turned on until an external reset is released by a microcomputer, an overcurrent protection circuit configured to perform output restriction of the switch signal so as to forcibly turn off the switch element in response to the overcurrent detection signal after the external reset is released, and a latch circuit configured to perform output restriction of the switch signal so as to forcibly turn off the switch element with the overcurrent detection signal serving as a latch trigger from when the power is turned on until the external reset is released by the microcomputer (first configuration).

In the load driving device having the first configuration, it is preferable that the latch circuit include a D flip-flop whose data terminal is fixed to a logic level at a latch-output time, whose clock terminal receives the overcurrent detection signal, whose reset terminal receives an external reset signal from the microcomputer, and whose output terminal outputs a latch signal, and a logic gate configured to fix the switch signal to a logic level at a switch-off time when the external reset signal is at a logic level at a reset time and also the latch signal is at a logic level at the latch-output time (second configuration).

In the load driving device having the first or second configuration, it is preferable that the overcurrent protection circuit be configured to start output restriction of the switch signal when the overcurrent detection signal has been maintained, over a predetermined mask time, at a logic level at a time when an overcurrent is being detected (third configuration).

In the load driving device having any one of the first to third configurations, it is preferable that, when a predetermined forced-off time has elapsed since a start of the output restriction of the switch signal, the overcurrent protection circuit release the output restriction of the switch signal (fourth configuration).

In the load driving device having any one of the first to fourth configurations, it is preferable that the driver portion be configured in an H-bridge arrangement including, as the switch element, a first upper switch element and a first lower switch element which are connected to a first terminal of the load, and a second upper switch element and a second lower switch element which are connected to a second terminal of the load, and that, from when the power is turned on until the external reset is released by the microcomputer, the logic portion maintain both the first upper switch element and the second upper switch element in an off state, and maintain both the first lower switch element and the second lower switch element in an on state (fifth configuration).

In the load driving device having the fifth configuration, it is preferable that, from when the power is turned on until the external reset is released by the microcomputer, the latch circuit performs the output restriction of the switch signal so as to forcibly turn off the first lower switch element and the second lower switch element with the overcurrent detection signal serving as a latch trigger (sixth configuration).

In the load driving device having the fifth or sixth configuration, it is preferable that the overcurrent detection portion include a plurality of detection circuits each configured to monitor a current flowing through a corresponding one of the first upper switch element, the second upper switch element, the first lower switch element, and the second lower switch element (seventh configuration).

According to another aspect of the present disclosure, an electronic apparatus includes a load, the load driving device having any one of the first to seventh configurations, the load driving device being configured to drive the load, and a microcomputer configured to feed an external reset signal to the load driving device (eighth configuration).

In the electronic apparatus having the eighth configuration, it is preferable that the load be a motor (ninth configuration).

According to another aspect of the present disclosure, a vehicle includes the electronic apparatus having the ninth configuration, and a battery configured to supply power to the electronic apparatus (tenth configuration).

Advantageous Effects of Invention

According to the invention disclosed herein, it is possible to provide a load driving device that is capable of performing an overcurrent protection operation even in a reset period.

BRIEF DESCRIPTION OF THE DRAWINGS

FIG. 2 is a waveform chart for illustrating a gate-signal generating operation in each operation mode.

DESCRIPTION OF EMBODIMENTS

<Electronic Apparatus>

Figure 1:
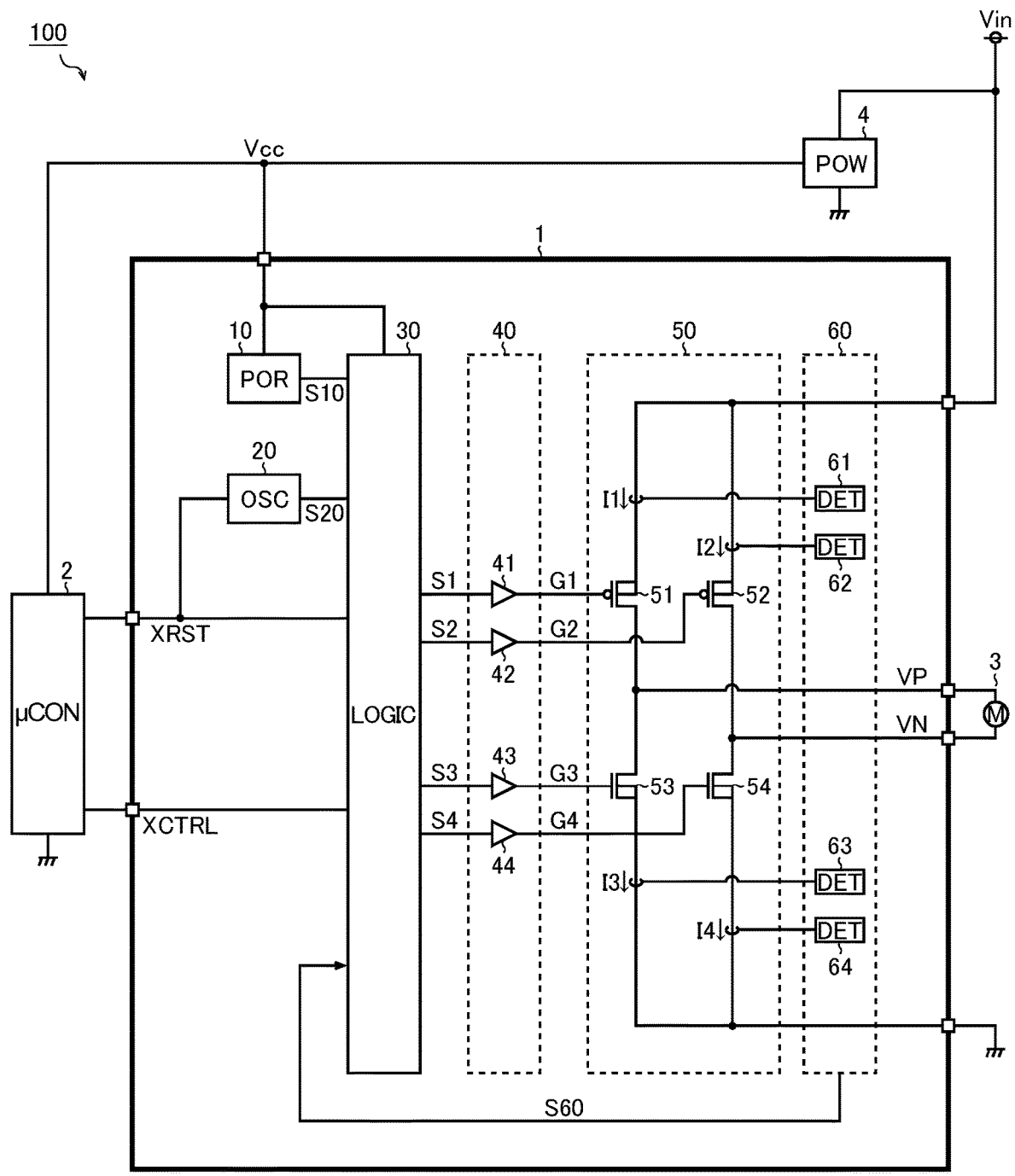
FIG. 1 is a block diagram showing an entire configuration of an electronic apparatus.
Figure 3A:
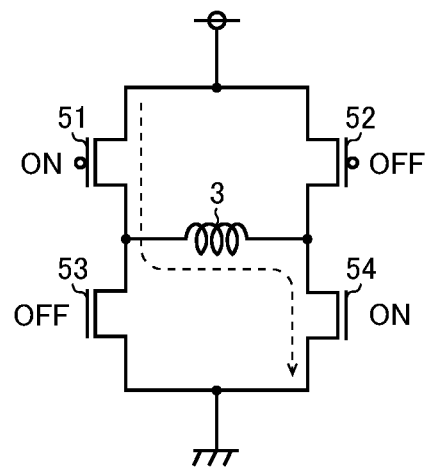
FIG. 3A is a schematic diagram showing a drive current path in a forward rotation mode.
Figure 3B:
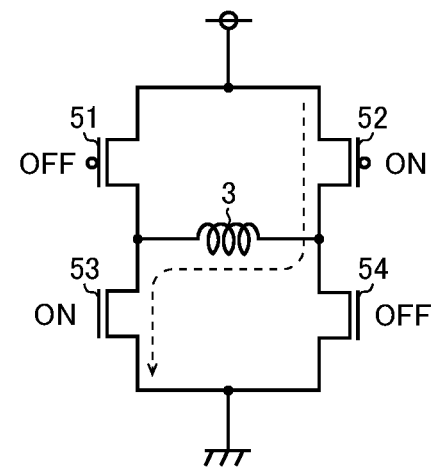
FIG. 3B is a schematic diagram showing a drive current path in a reverse rotation mode.
Figure 3C:
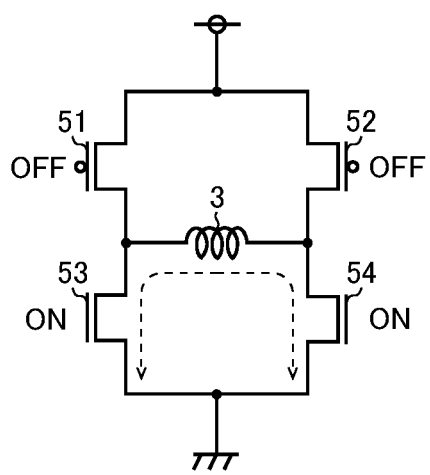
FIG. 3C is a schematic diagram showing a drive current path in a brake mode.
Figure 3D:
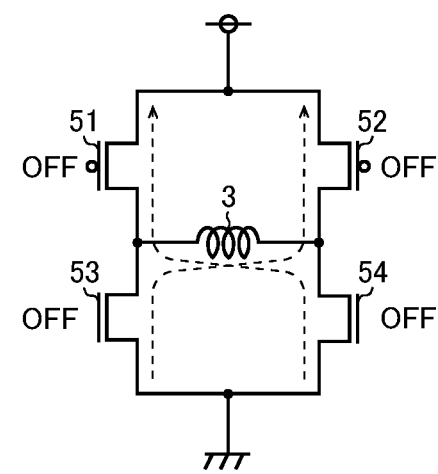
FIG. 3D is a schematic diagram showing a drive current path in an idle mode.

FIG. 1 is a block diagram showing an entire configuration of an electronic apparatus. The electronic apparatus 100 of the present configuration example includes a motor driving device 1, a microcomputer 2, a motor 3, and a power supply device 4.

The motor driving device 1, which operates by being supplied with an input voltage Vin and a power supply voltage Vcc, is an example of a load driving device configured to drive the motor 3 in accordance with an external control signal XCTRL and an external reset signal XRST, of which both are received from the microcomputer 2.

The microcomputer 2 operates by being supplied with the power supply voltage Vcc, and generally controls the operation of the electronic apparatus 100. For example, in controlling the driving of the motor 3, the microcomputer 2 feeds the external control signal XCTRL and the external reset signal XRST to the motor driving device 1. The external control signal XCTRL includes control commands for specifying the operation mode of the motor 3 (a forward rotation mode FWD, a reverse rotation mode REV, a brake mode BRK, an idle mode IDL), the rotation rate, and so on, of the motor 3. On the other hand, the external reset signal XRST is a binary signal for resetting the motor driving device 1 to its initial state.

The motor 3 is a load that is driven by the motor driving device 1. In the example shown in the figure, what is used as the motor 3 is a single-phase brushed DC motor which rotates in a direction that is in accordance with a current flowing through a motor coil.

The power supply device 4 is a semiconductor device (what is called a regulator IC) which generates a desired power supply voltage Vcc from the input voltage Vin to supply the resulting power supply voltage Vcc to the motor driving device 1 and the microcomputer 2.

<Motor Driving Device>

To follow is a detailed description of a configuration and an operation of the motor driving device 1 with reference to FIG. 1. The motor driving device 1 of the present configuration example is a semiconductor device (what is called a motor driver IC) which has integrated therein a power on reset portion 10, an oscillation portion 20, a logic portion 30, a pre-driver portion 40, a driver portion 50, and an overcurrent detection portion 60.

The power on reset portion 10 monitors the power supply voltage Vcc, and generates a power on reset signal S10. The power on reset signal S10 is at low level (=the logic level at a time of power on reset) when the power supply voltage Vcc is lower than a threshold voltage Vth, and at high level (=the logic level at a time when power on reset is released) when the power supply voltage Vcc is higher than the threshold voltage Vth.

The oscillation portion 20 generates a clock signal S20 with an oscillation frequency fc, and feeds the clock signal S20 to the logic portion 30. The clock signal S20 is used as a driving clock for the logic portion 30. Here, the oscillation portion 20 is reset controlled in accordance with the external reset signal XRST. Specifically, the oscillation portion 20 stops the clock generating operation when the external reset signal XRST is at low level (=the logic level at a time of an external reset), and performs the clock generating operation when the external reset signal XRST is at high level (=the logic level at a time when the external reset is released).

The logic portion 30 is a circuit portion arranged to control turning on/off of transistors 51 to 54 included in the driver portion 50 by being supplied with the power supply voltage Vcc, and generates switch signals S1 to S4 in accordance with the external control signal XCTRL. Here, the logic portion 30 is reset controlled in accordance with both of the power on reset signal S10 and the external reset signal XRST. Further, the logic portion 30 is provided also with a function of restricting outputs of the switch signals S1 to S4 in response to an overcurrent detection signal S60 (=what is called the overcurrent protection function). Descriptions will be given later of a configuration and an operation of the logic portion 30.

The pre-driver portion 40 is a circuit portion for actually driving the transistors 51 to 54 in accordance with the switch signals S1 to S4, and includes pre-drivers 41 to 44. The pre-drivers 41 to 44 generate gate signals G1 to G4 on receiving the switch signals S1 to S4, respectively, and output the switch signals S1 to S4 to the transistors 51 to 54, respectively.

The driver portion 50 includes the four transistors 51 to 54 (PMOSFETs 51 and 52, and NMOSFETs 53 and 54) which are connected to the motor 3 in an H-bridge arrangement. Here, the transistor 51 corresponds to a first upper switch element which is connected to a first terminal (=an application terminal to which an output voltage VP is applied) of the motor 3. The transistor 52 corresponds to a second upper switch element which is connected to a second terminal (=an application terminal to which an output voltage VN is applied) of the motor 3. The transistor 53 corresponds to a first lower switch element which is connected to the first terminal of the motor 3. The transistor 54 corresponds to a second lower switch element which is connected to the second terminal of the motor 3.

Specific connection relationships between the elements are as follows. Sources and backgates of the transistors 51 and 52 are connected to an input terminal (=an application terminal to which the input voltage Vin is applied). Sources and backgates of the transistors 53 and 54 are connected to a ground terminal (=an application terminal to which a ground voltage GND is applied). Drains of the transistors 51 and 53 are connected to a first output terminal to which the first terminal of the motor 3 is externally connected. Drains of the transistors 52 and 54 are connected to a second output terminal to which the second terminal of the motor 3 is externally connected.

Gates of the transistors 51 to 54 are respectively connected to output terminals of the pre-drivers 41 to 44 (=application terminals to which the gate signals G1 to G4 are respectively applied). Here, the transistors 51 and 52 are in an off state respectively when the gate signals G1 and G2 are at high level, and are in the on state respectively when the gate signals G1 and G2 are at low level. On the other hand, the transistors 53 and 54 are in the on state respectively when the gate signals G3 and G4 are at high level, and are in the off state respectively when the gate signals G3 and G4 are at low level.

The overcurrent detection portion 60 includes detection circuits 61 to 64 which individually monitor output currents I1 to I4, respectively, which respectively flow through the transistors 51 to 54, and outputs the overcurrent detection signal S60 in accordance with the respective detection results. The overcurrent detection signal S60 is at low level (=the logic level at a time when no overcurrent is being detected) when no overcurrent is being detected in any of the detection circuits 61 to 64, and is at high level (=the logic level at a time when an overcurrent is being detected) when an overcurrent is being detected in at least one of the detection circuits 61 to 64. However, this is not meant to limit the method for detecting an overcurrent; for example, a sink current which flows from the driver portion 50 to the ground terminal may be monitored to thereby detect an overcurrent in a unified manner. Further, in the present figure, for convenience of illustration, detection signals from the detection circuits 61 to 64 are integrated into one system of the overcurrent detection signal S60 which is fed to the logic portion 30, but instead, four systems of the detection signals respectively generated by the detection circuits 61 to 64 may be individually fed to the logic portion 30. Note that, to prevent malfunction ascribable to noise and so on, it is desirable that, when the output is in the off state, the logic portion 30 does not perform the overcurrent protection operation even if an overcurrent is detected.

<Operation Modes>

FIG. 2 is a waveform chart for illustrating a gate-signal generating operation in the various operation modes (the forward rotation mode FWD, the reverse rotation mode REV, the brake mode BRK, the idle mode IDL). FIG. 3A to FIG. 3D are schematic diagrams showing drive current paths in the respective operation modes (the forward rotation, reverse rotation, brake, and idle modes).

In the forward rotation mode (FWD), the gate signals G1 to G4 are generated so as to turn on the transistors 51 and 54 and turn off the transistors 52 and 53. With such gate driving, a drive current flows in the path indicated by the broken line arrow in FIG. 3A to cause the forward rotation of the motor 3.

In the reverse rotation mode (REV), the gate signals G1 to G4 are generated so as to turn off the transistors 51 and 54 and turn on the transistors 52 and 53. With such gate driving, a drive current flows in the path indicated by the broken line arrow in FIG. 3B to cause the reverse rotation of the motor 3.

In the brake rotation mode (BRK), the gate signals G1 to G4 are generated so as to turn off the transistors 51 and 52 and turn on the transistors 53 and 54. With such gate driving, the two terminals of the motor 3 are short-circuited to the ground terminal through the path indicated by the broken line arrow in FIG. 3C to brake the motor 3.

In the idle mode (IDL), the gate signals G1 to G4 are generated so as to turn off all the transistors 51 to 54. With such gate driving, a counter electromotive current flows in the path indicated by the broke line arrow in FIG. 3D (=a path via body diodes of the transistors 51 to 54) to cause idling of the motor 3 along with which power regeneration is performed. Here, in a case where no power regeneration is performed, simply the motor 3 is brought into a free state.

<Overcurrent Detection Portion>

Figure 4:
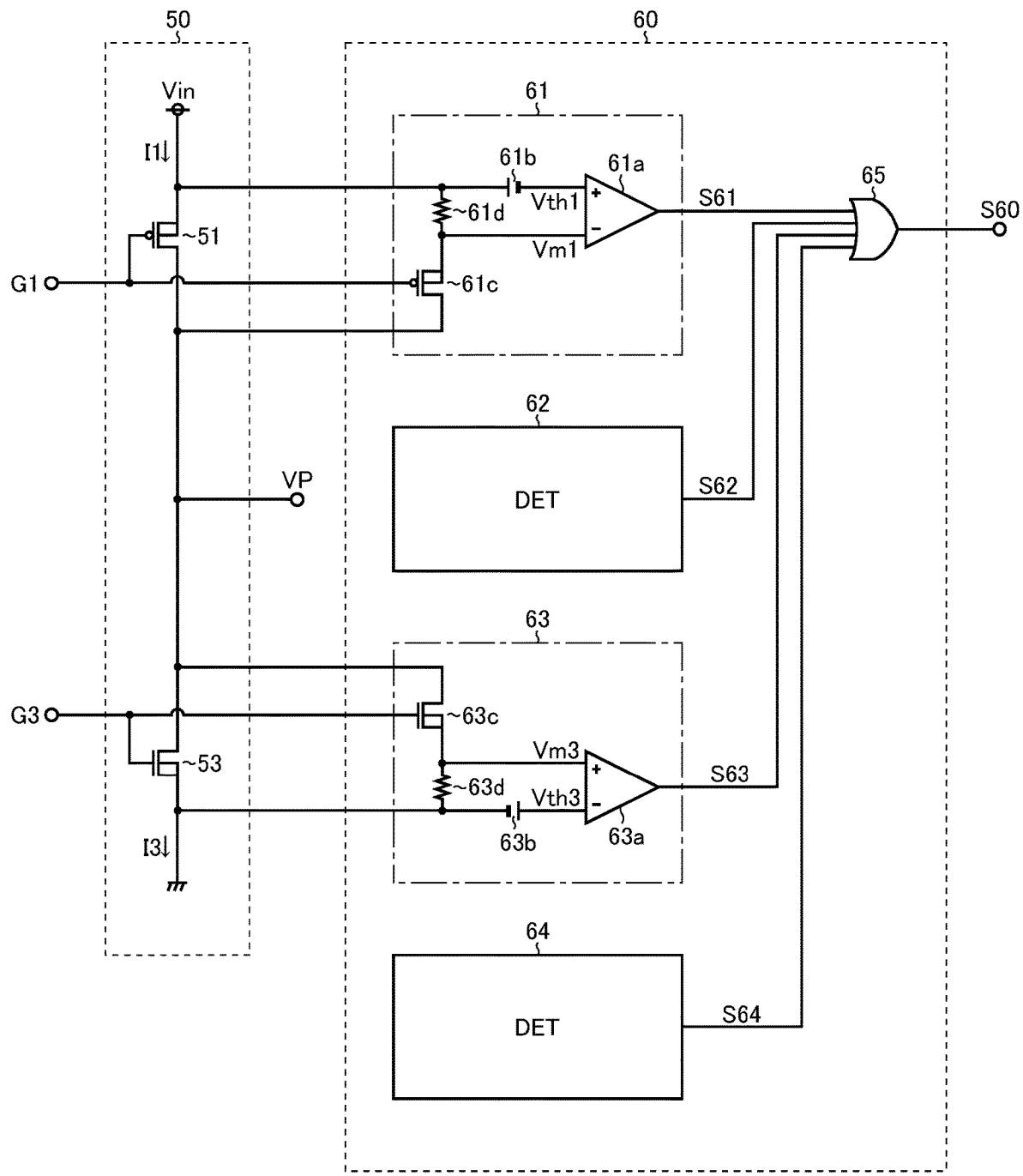
FIG. 4 is a circuit diagram showing a configuration example of an overcurrent detection portion.

FIG. 4 is a circuit diagram showing a configuration example of the overcurrent detection portion 60. The overcurrent detection portion 60 of the present configuration example includes an OR gate 65, in addition to the above-described detection circuits 61 to 64. In the present figure, for convenience of description, the OR gate 65 is illustrated as a component of the overcurrent detection portion 60, but this is not meant to limit the configuration of the motor driving device 1, and the OR gate 65 may be a component of the logic portion 30.

The detection circuits 61 to 64 respectively monitors the output currents I1 to I4, and respectively generate detection signals S61 to S64. The detection signals S6* (where *=1 to 4, this applies hereinafter in this paragraph) are respectively at low level (=the logic level at a time when no overcurrent is being detected) when the output currents I* are less than threshold currents Ith*, and are respectively at high level (=the logic level at a time when an overcurrent is being detected) when the output currents I* are lower than the threshold currents Ith*.

The OR gate 65 performs an OR operation of the detection signals S61 to S64 to thereby generate the overcurrent detection signal S60. Accordingly, the overcurrent detection signal S60 is at low level (the logic level at the time when no overcurrent is being detected) when the detection signals S61 to S64 are all at low level, and is at high level (=the logic level at the time when an overcurrent is being detected) when at least one of the detection signals S61 to S64 is at high level. Here, in the case where the OR gate 65 is a component of the logic portion 30, the detection signals S61 to S64 can be individually fed to the logic portion 30.

Next, a detailed description will be given of configurations and operations of the detection circuits 61 to 64, by taking as examples, in particular, the detection circuits 61 and 63 connected to the transistors 51 and 53.

The detection circuit 61 includes a comparator 61a, a voltage supply 61b, a transistor 61c, and a resistor 61d.

A positive terminal of the voltage supply 61b and a first terminal of the resistor 61d are both connected to the source of the transistor 51. A negative terminal of the voltage supply 61b is, as an application terminal to which a threshold voltage Vth1 (<Vin) is applied, connected to a noninverting input terminal (+) of the comparator 61a. A second terminal of the resistor 61d is connected to each of an inverting input terminal (−) of the comparator 61a and a source of the transistor 61c. A drain of the transistor 61c is connected to the drain of the transistor 51. A gate of the transistor 61c is connected to the application terminal to which the gate signal G1 is applied. An output terminal of the comparator 61a corresponds to an output terminal from which the detection signal S61 is outputted.

In the detection circuit 61 of the present configuration example, the transistor 61c is in the off state in a high-level period of the gate signal G1, and is in the on state in a low-level period of the gate signal G1. That is, the transistor 61c is turned on/off in synchronism with the transistor 51. Accordingly, a monitor voltage Vm1 applied to the inverting input terminal (−) of the comparator 61a is equal to the output voltage VP when the transistor 51 is in the on state, and when the transistor 51 is in the off state, the monitor voltage Vm1 is pulled-up to the input voltage Vin via the resistor 61d.

Here, the monitor voltage Vm1, which is obtained when the transistor 51 is in the on state, has a voltage value (=Vin−I1×Ron1, where Ron1 is an ON resistance of the transistor 51) that is lower than the input voltage Vin by a voltage across the two terminals of the transistor 51. That is, assuming that the ON resistance Ron1 of the transistor 51 has a constant value, the monitor voltage Vm1 obtained when the transistor 51 is in the on state decreases as the output current I1 increases.

Accordingly, by comparing the monitor voltage Vm1 with the threshold voltage Vth1 by using the comparator 61a, it is possible to determine whether or not the output current I1 is in an overcurrent state.

More specifically, the detection signal S61 is at high level (=the logic level at the time when an overcurrent is being detected) when the monitor voltage Vm1 is lower than the threshold voltage Vth1, and the detection signal S61 is at low level (=the logic level at the time when no overcurrent is being detected) when the monitor voltage Vm1 is higher than the threshold voltage Vth1. That is, the detection signal S61 is at high level when the output current I1 is larger than a threshold current Ith1 (=(Vin−Vth1)/Ron1), and the detection signal S61 is at low level when the output current I1 is smaller than the threshold current Ith1.

The detection circuit 63 of the present configuration example includes a comparator 63a, a voltage supply 63b, a transistor 63c, and a resistor 63d.

A negative terminal of the voltage supply 63b and a first terminal of the resistor 63d are both connected to the source of the transistor 53. A positive terminal of the voltage supply 63b is, as an application terminal to which a threshold voltage Vth3 (>GND) is applied, connected to an inverting input terminal (−) of the comparator 63a. A second terminal of the resistor 63d is connected to both of a noninverting input terminal (+) of the comparator 63a and a source of the transistor 63c. A drain of the transistor 63c is connected to the drain of the transistor 53. A gate of the transistor 63c is connected to the application terminal to which the gate signal G3 is applied. An output terminal of the comparator 63a corresponds to an output terminal from which the detection signal S63 is outputted.

In the detection circuit 63 of the present configuration example, the transistor 63c is in the on state in a high-level period of the gate signal G3, and is in the off state in a low-level period of the gate signal G3. That is, the transistor 63c is turned on/off in synchronism with the transistor 53. Accordingly, a monitor voltage Vm3 applied to the noninverting input terminal (+) of the comparator 63a is equal to the output voltage VP when the transistor 53 is in the on state, and when the transistor 53 is in the off state, the monitor voltage Vm3 is pulled-down to the ground voltage GND (=0 V) via the resistor 63d.

Here, the monitor voltage Vm3, which is obtained when the transistor 53 is in the on state, has a voltage value (=I3×Ron3, where Ron3 is an ON resistance of the transistor 53) that is higher than the ground voltage GND by a voltage across the two terminals of the transistor 53. That is, assuming that the ON resistance Ron3 of the transistor 53 has a constant value, the monitor voltage Vm3 obtained when the transistor 53 is in the on state increases as the output current I3 increases.

Accordingly, by comparing the monitor voltage Vm3 with the threshold voltage Vth3 by using the comparator 63a, it is possible to determine whether or not the output current I3 is in the overcurrent state.

More specifically, the detection signal S63 is at high level (=the logic level at the time when an overcurrent is being detected) when the monitor voltage Vm3 is higher than the threshold voltage Vth3, and the detection signal S63 is at low level (=the logic level at the time when no overcurrent is being detected) when the monitor voltage Vm3 is lower than the threshold voltage Vth3. That is, the detection signal S63 is at high level when the output current I3 is larger than a threshold current Ith3 (=Vth3/Ron3), and the detection signal S63 is at low level when the output current I3 is smaller than the threshold current Ith3.

Thus, with the configuration where an overcurrent is detected by using the ON resistances of the transistors 51 and 53, there is no need of inserting a sense resistor in the current paths where the output currents I1 and I3 flow, and this contributes to lower cost and lower power consumption.

Note that the same configurations as the detection circuits 61 and 63 can be adopted in the detection circuits 62 and 64, which are respectively connected to the transistors 52 and 54. That is, configurations and operations of the detection circuits 62 and 64 can be understood by replacing, regarding the reference signs and numbers in the above description, the ones place digits "1" and "3" with "2" and "4", respectively, and replacing the output voltage "VP" with the output voltage "VN". Thus, the overlapping descriptions will be omitted.

<Logic Portion (First Embodiment)>

Figure 5:
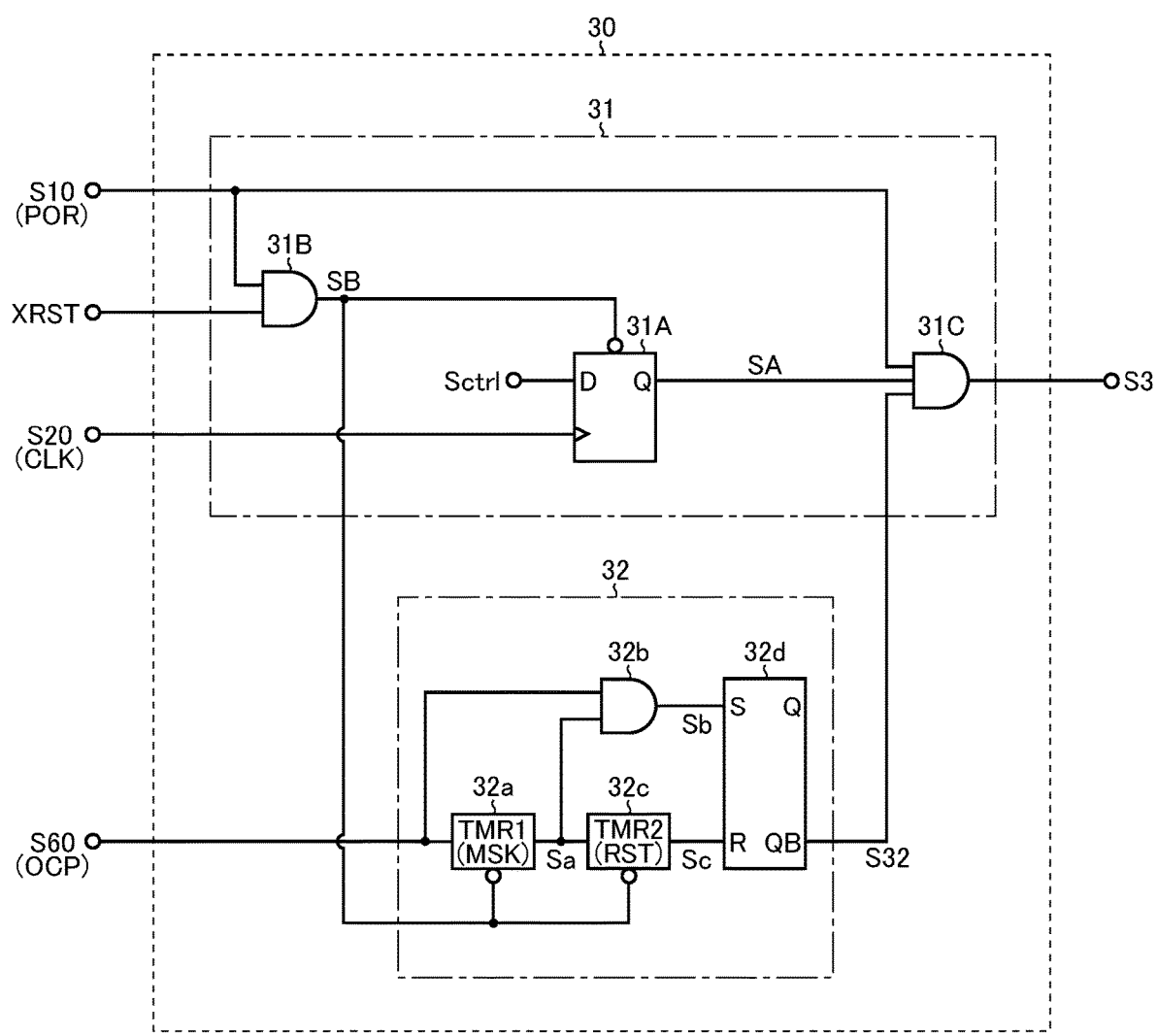
FIG. 5 is a block diagram showing a first embodiment of a logic portion.

FIG. 5 is a block diagram showing a first embodiment (in particular, around a switch signal S3 output stage) of the logic portion 30. The logic portion 30 of the present embodiment includes a switch signal generation circuit 31 and an overcurrent protection circuit 32.

The switch signal generation circuit 31 includes a D flip-flop 31A, and AND gates 31B and 31C.

A data terminal (D) of the D flip-flop 31A receives an internal control signal Sctrl. The internal control signal Sctrl is a binary signal for determining the logic level of the switch signal S3 in accordance with the external control signal XCTRL, and the internal control signal Sctrl is generated in an unillustrated internal circuit. A clock terminal of the D flip-flop 31A receives the clock signal S20. A set terminal of the D flip-flop 31A receives an AND signal SB. An output terminal (Q) of the D flip-flop 31A outputs a latch signal SA.

The thus connected D flip-flop 31A latches and outputs the internal control signal Sctrl, with a pulse edge of the clock signal S20 serving as a latch trigger, to thereby generate the latch signal SA. However, in a low-level period of the AND signal SB, the latch signal SA is set to high level, without depending on the logic level of the internal control signal Sctrl.

The AND gate 31B performs an AND operation of the power on reset signal S10 and the external reset signal XRST to thereby generate the AND signal SB. Accordingly, the AND signal SB is at low level (=the logic level at a time of a reset) when at least one of the power on reset signal S10 and the external reset signal XRST is at low level, and the AND signal SB is at high level (=the logic level at a time when the reset is released) the power on reset signal S10 and the external reset signal XRST are both at high level.

The AND gate 31C performs an AND operation of the power on reset signal S10, the latch signal SA, and an overcurrent protection signal S32 to thereby generate the switch signal S3. Accordingly, the switch signal S3 is at low level when at least one of these three signals is at low level, and the switch signal S3 is at high level when these three signals are all at high level.

The overcurrent protection circuit 32 includes a first timer 32a, an AND gate 32b, a second timer 32c, and an RS flip-flop 32d.

The first timer 32a starts a count operation of counting a mask time T1 (10 µs, for example) when the overcurrent detection signal S60 has risen to high level (=the logic level at a time when an overcurrent is being detected), and when the count operation is completed, the first timer 32a raises a first timer signal Sa to high level. Here, a reset terminal of the first timer 32a receives the AND signal SB, and in a low-level period of the AND signal SB is at low level, the first timer signal Sa is reset to low level.

The AND gate 32b performs an AND operation of the overcurrent detection signal S60 and the first timer signal Sa to thereby generate an AND signal Sb. Accordingly, the AND signal Sb is at low level when at least one of the overcurrent detection signal S60 and the first timer signal Sa is at low level (=the logic level at a time when no overcurrent is being detected), and the AND signal Sb is at high level when the overcurrent detection signal S60 and the first timer signal Sa are both at high level (=the logic level at a time when an overcurrent is being detected).

The second timer 32c starts a count operation of counting a forced-off time T2 (255 µs, for example) when the first timer signal Sa has risen to high level, and when the count operation is completed, raises a second timer signal Sc to high level. Here, a reset terminal of the second timer 32c receives the AND signal SB, and in a low-level period of the AND signal SB, the second timer signal Sc is reset to low level.

A set terminal (S) of the RS flip-flop 32d receives the AND signal Sb. A reset terminal (R) of the RS flip-flop 32d receives the second timer signal Sc. An inverting output terminal (QB) of the RS flip-flop 32d outputs the overcurrent protection signal S32.

The thus connected RS flip-flop 32d sets the overcurrent protection signal S32 to low level in response to a rising edge of the AND signal Sb, and resets the overcurrent protection signal S32 to high level in response to a rising edge of the second timer signal Sc. Here, in a low-level period of the AND signal SB, the AND signal Sb and the second timer signal Sc are both at low level. Accordingly, the overcurrent protection signal S32 is in a state of being reset to high level.

In the present figure, for convenience of illustration, only the output stage of the switch signal S3 is depicted, but the configuration as shown in the present figure can be adopted also in other output stages. That is, configurations and operations of other output stages can be understood by replacing, regarding the reference signs and numbers in the above description, "S3" in the switch signal S3 with "S1", "S2", or "S4". Thus, the overlapping descriptions will be omitted.

Figure 6:
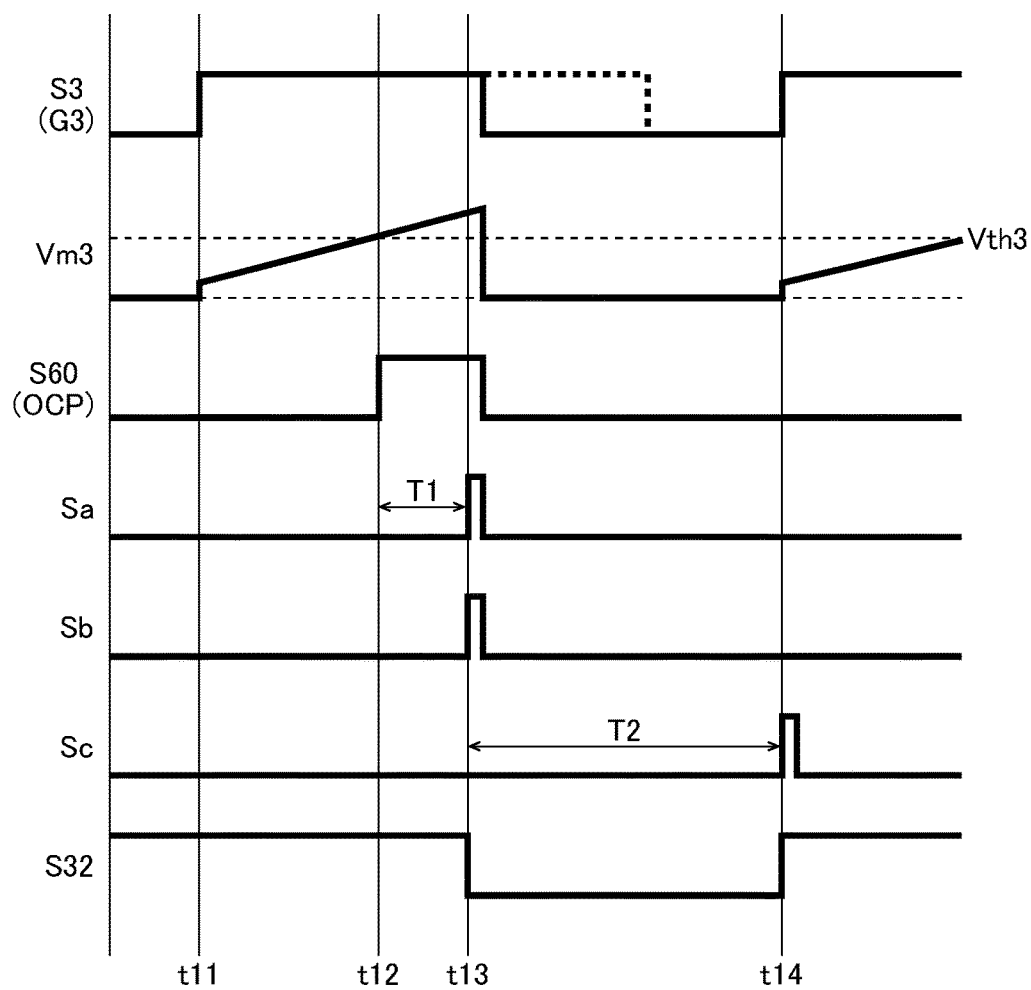
FIG. 6 is a timing chart showing an example of an overcurrent protection operation performed in a stable period.

FIG. 6 is a timing chart showing an example of the overcurrent protection operation performed in a stable period (S10=H, XRST=H). Depicted in the figure are, from top to bottom, the switch signal S3 (thus the gate signal G3), the monitor voltage Vm3, the overcurrent detection signal S60, the first timer signal Sa, the AND signal Sb, the second timer signal Sc, and the overcurrent protection signal S32.

When, at time t11, the switch signal S3 is raised to high level, the transistor 53 is turned on and the output current I3 starts to flow, so that the monitor voltage Vm3 starts to rise. At this time point, the monitor voltage Vm3 is lower than the threshold voltage Vth3, and thus the overcurrent detection signal S60 is at low level, and the first timer signal Sa, the AND signal Sb, and the second timer signal Sc are all at low level. Accordingly, the overcurrent protection signal S32 is maintained at high level, and thus output restriction (=fixation to low level) of the switch signal S3 is not performed.

Then, the output current I3 increases and when, at time t12, the monitor voltage Vm3 becomes higher than the threshold voltage Vth3, the overcurrent detection signal S60 rises to high level. However, at this time point, the first timer signal Sa is maintained at low level, and thus the AND signal Sb and the second timer signal Sc both remain at low level. Accordingly, the overcurrent protection signal S32 is maintained at high level.

When the mask time T1 elapses since time t12 with the overcurrent detection signal S60 maintained at high level, then at time t13, the first timer signal Sa rises to high level. As a result, the AND signal Sb rises to high level, and thus the overcurrent protection signal S32 is reset to low level. At this time, the switch signal S3 is caused to fall to low level without depending on the logic level of the latch signal SA, and the transistor 53 is forcibly turned off (see the broken line of the switch signal S3). As a result, the current path of the output current I3 is cut off, and thus a further increase of the output current I3 (=overcurrent) is prevented.

Thus, the overcurrent protection circuit 32 starts the output restriction of the switch signal S3 when the overcurrent detection signal S60 has been maintained at high level over the mask time T1. With such a configuration, even if noise less than the mask time T1 is superimposed on the overcurrent detection signal S60, the output restriction of the switch signal S3 is not started. This helps make the overcurrent protection circuit 32 more noise resistant.

Here, when, along with the cutting-off of the output current I3 at time t13, the monitor voltage Vm3 becomes lower than the threshold voltage Vth3, the overcurrent detection signal S60 falls to low level, and thus both the first timer signal Sa and the AND signal Sb also fall to low level. On the other hand, the overcurrent protection signal S32 is maintained at low level until the second timer signal Sc rises to high level, and thus the overcurrent protection operation continues to be performed.

When the forced-off time T2 has elapsed from time t13, the second timer signal Sc rises to high level at time t14, and thus the overcurrent protection signal S32 is reset to high level. As a result, the output restriction of the switch signal S3 is released, and thus the on/off driving of the transistor 53 is restarted.

Thus, the overcurrent protection circuit 32 automatically releases the output restriction of the switch signal S3 when the forced-off time T2 has elapsed since the start of the output restriction of the switch signal S3. With such a configuration, even after the overcurrent protection is once started, attempts are regularly made to restart the driving of the motor 3, and thus, for example, even in a case where the driving of the motor 3 has been stopped due to a temporary overcurrent, it is possible to allow the driving of the motor 3 to recover by itself quickly if the overcurrent is no longer flowing. This helps enhance the driving stability of the motor 3.

Figure 7:
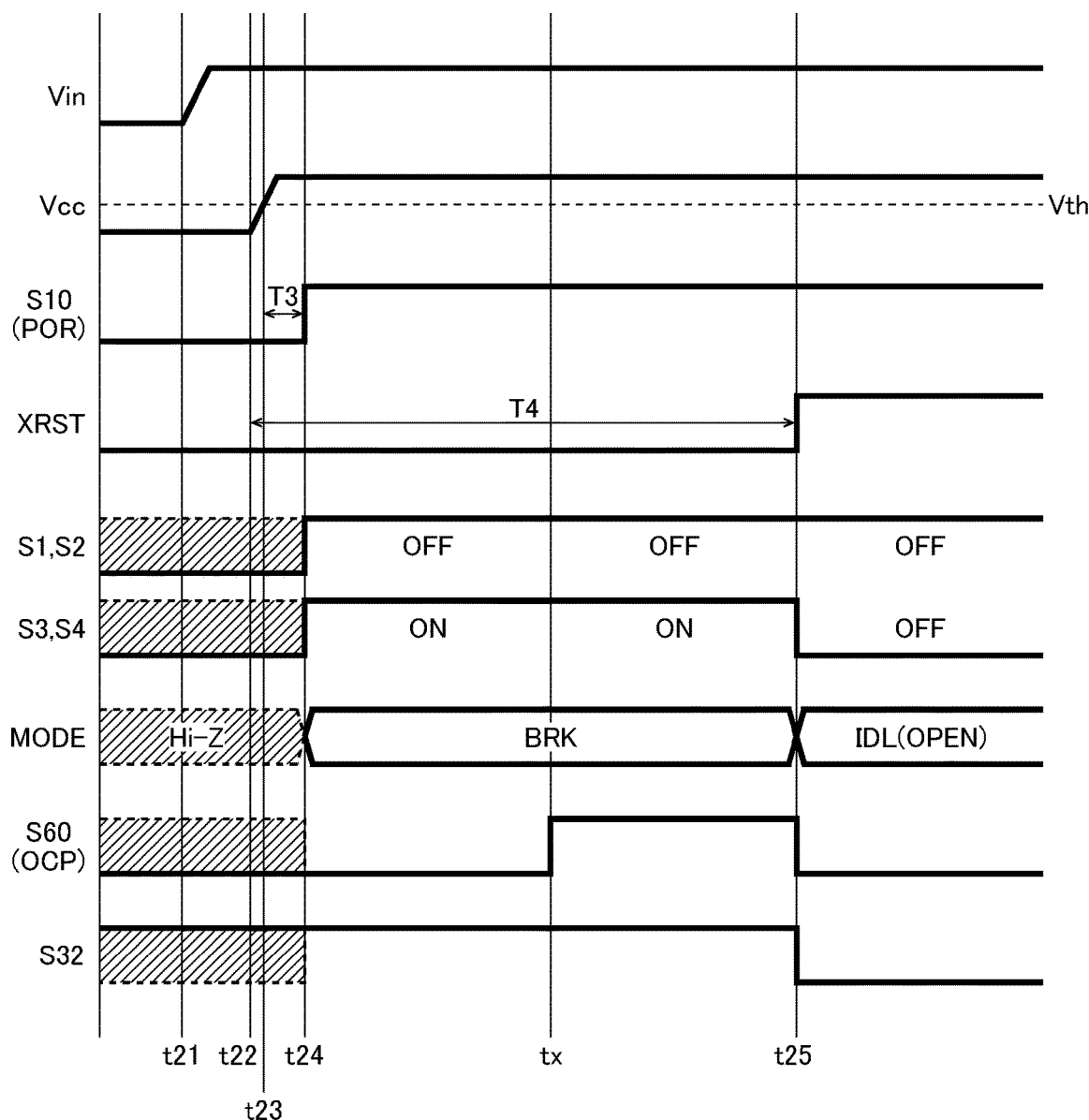
FIG. 7 is a timing chart showing an example of an overcurrent protection operation performed at startup.

FIG. 7 is a timing chart showing an example of the overcurrent protection operation performed at a startup of the electronic apparatus 100. Depicted in the figure are, from top to bottom, the input voltage Vin, the power supply voltage Vcc, the power on reset signal S10, the external reset signal XRST, the switch signals S1 and S2, the switch signals S3 and S4, the operation mode MODE, the overcurrent detection signal S60, and the overcurrent protection signal S32.

When, at time t21, the input voltage Vin is fed to the electronic apparatus 100, the power supply device 4 starts up, and, at time t22, the power supply voltage Vcc starts to rise. Then, when, at time t23, the power supply voltage Vcc becomes higher than the threshold voltage Vth, a signal delay time T3 within a power on reset portion 10 elapses until time t24, at which the power on reset signal S10 rises to high level (=the logic level at a time when power on reset is released).

Here, before time t24, the motor driving device 1 is in a non-operating state. Accordingly, internal signals (the switch signals S1 to S4, the overcurrent detection signal S60, the overcurrent protection signal S32) of the motor driving device 1 are all in a logic unstable state, and thus the two terminals of the motor 3 are in a high impedance state (Hi-Z) (see hatched areas in the figure).

Further, after the power supply device 4 starts up at time t22, it takes a predetermined startup time T4 (several tens ms to several hundreds ms) for the initial setting and the like of the microcomputer 2 to be completed at time t25. Meanwhile, the external reset signal XRST is maintained at low level (=the logic level at a time of an external reset).

Accordingly, even after the power on reset signal S10 rises to high level at time t24, the motor driving device 1 remains in an external reset state until the external reset signal XRST rises to high level at time t25.

Here, from when the power is turned on until the external reset is released by the microcomputer 2, the logic portion 30 (specifically, the switch signal generation circuit 31) maintains the switch signals S1 to S4 all at high level so as to maintain the transistors 51 and 52 in an off state by default and maintain the transistors 53 and 54 in an on state by default.

The above-described default output operation will be specifically described with reference to FIG. 5, which has already been referred to above. From when the power is turned on until the external reset is released by the microcomputer 2 (that is, while the power on reset signal S10 is at high level and the external reset signal XRST is at low level), the AND signal SB is at low level, and thus the latch signal SA and the overcurrent protection signal S32 are both at high level. Accordingly, the three signals (S10, SA, S32) that the AND gate 31C receives are all at high level, and thus the switch signal S3 is at high level. This applies to the other switch signals S1, S2, and S4.

With such a default output operation, it is possible to put the motor 3 into the brake mode (see FIG. 2 and FIG. 3C) to securely maintain the motor 3 at rest while the motor driving device 1 is in an external reset state. This helps enhance the safety of the electronic apparatus 100.

However, in an external reset period (XRST=L) of the motor driving device 1, as already stated above, the overcurrent protection circuit 32 of the logic portion 30 is in an external reset state, and thus the overcurrent protection operation cannot be started. In other words, the overcurrent protection circuit 32 is a circuit configured only to perform the overcurrent protection operation after the external reset is released, and thus is not able to reduce generation of overcurrent in the external reset period.

Assume a case, for example, where, in the external reset period of the motor driving device 1 (see time tx in FIG. 7), power supply fault abnormality (=short circuit to the application terminal of the input voltage Vin or to a high-potential terminal equivalent to it) has occurred at the first terminal of the motor 3. In this case, the output current I3 that flows via the transistor 53, which has been turned on to put the motor 3 into the brake mode (BRK), is excessive. In this state, the overcurrent detection signal S60 rises to high level, but the logic portion 30 (more specifically the overcurrent protection circuit 32) still remains in the external reset state. Thus, at time tx, it is impossible to start appropriate overcurrent protection.

Then, when, at time t25, the external reset signal XRST is raised to high level, the external reset of the logic portion 30 is released, and thus it finally becomes possible to start the overcurrent protection. Specifically, by forcibly turning off the transistors 53 and 54, the idle mode is started (see FIG. 2 and FIG. 3D), in which the terminals of the motor 3 are both opened. The present figure, for convenience of illustration, depicts how the overcurrent protection is started without delay after the external reset is released at time t25, but actually, as shown in FIG. 6 already referred to above, the overcurrent protection is started at a time point at which the mask time T1 has elapsed since time t25, the overcurrent protection is started with a more delayed timing.

Thus, with the logic portion 30 of the present embodiment, since the overcurrent protection function is not active in the external reset period which is immediately after the power is turned on, there occurs a delay in starting the overcurrent protection. In particular, in a case where power supply fault abnormality has already occurred before the power is turned on, an overcurrent continues to flow over a long period of time with no restriction at all, and thus there is a possibility of destruction of the motor driving device 1, abnormal heat generation in the motor driving device 1, etc.

Thus, it can be said that to enhance the safety of the electronic apparatus 100, where it is necessary to maintain the transistors 53 and 54 in the on state in the external reset period, there is yet a room for improvement in the logic portion 30 of the motor driving device 1.

<Logic Portion (Second Embodiment)>

Figure 8:
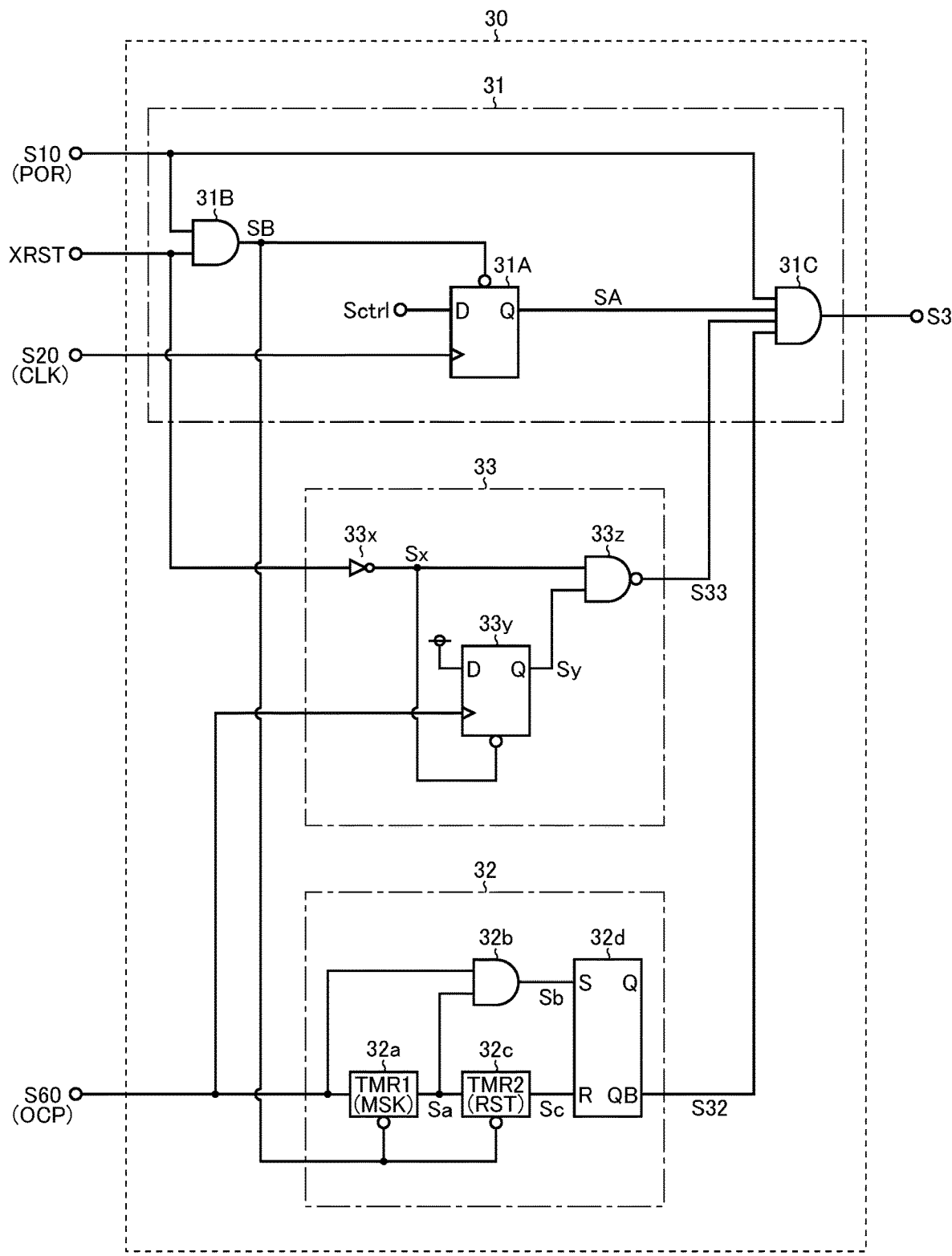
FIG. 8 is a block diagram showing a second embodiment of the logic portion.

FIG. 8 is a block diagram showing a second embodiment of the logic portion 30. The logic portion 30 of the present embodiment, which is based on the above-described first embodiment (FIG. 5), is characterized by further including a latch circuit 33. Thus, the overlapping descriptions will be omitted by giving the same reference symbols as those in FIG. 5 to the same components as those in the first embodiment, and the following description will focus mainly on the distinctive feature of the second embodiment.

The latch circuit 33 includes an inverter 33x, a D flip-flop 33y, and a NAND gate 33z.

The inverter 33x inverts the logic of the external reset signal XRST to thereby generate an inverted signal Sx. Accordingly, the inverted signal Sx is at low level when the external reset signal XRST is at high level, and the inverted signal Sx is at high level when the external reset signal XRST is at low level.

A data terminal (D) of the D flip-flop 33y is fixed to the power supply voltage Vcc (the logic level at a time of latch-output). A clock terminal of the D flip-flop 33y receives the overcurrent detection signal S60. A reset terminal of the D flip-flop 33y receives the inverted signal Sx. An output terminal (Q) of the D flip-flop 33y outputs the latch signal Sy.

The thus connected D flip-flop 33y raises the latch signal Sy to high level, with a rising edge of the overcurrent detection signal S60 serving as a latch trigger. However, in a low-level period of the inverted signal Sx (that is, at a time when external reset is released and thus the external reset signal XRST is at high level), the latch signal Sy is reset to low level.

The NAND gate 33z performs a NAND operation of the inverted signal Sx and the latch signal Sy to thereby generate a second overcurrent protection signal S33. Accordingly, the second overcurrent protection signal S33 is at high level when at least one of the inverted signal Sx and the latch signal Sy is at low level, and the second overcurrent protection signal S33 is at low level when the inverted signal Sx and the latch signal Sy are both at high level.

The second overcurrent protection signal S33 is fed to the AND gate 31C, as well as the power on reset signal S10, the latch signal SA, and the overcurrent protection signal S32. The AND gate 31C performs an AND operation of these four signals (S1, SA, S32, S33) to thereby generates the switch signal S3. Accordingly, the switch signal S3 is at low level when at least one of these four signals is at low level, and the switch signal S3 is at high level when these four signals are all at high level.

In the present figure, for convenience of illustration, only the output stage of the switch signal S3 is depicted, but the configuration as shown in the present figure can be adopted in the output stage of the switch signal S4. In that case, a configuration and an operation of the output stage of the switch signal S4 can be understood by replacing, regarding the reference signs and numbers in the above description, "S3" in the switch signal S3 with "S4". Thus, the overlapping descriptions will be omitted. On the other hand, in the output stages of the switch signals S1 and S2, the configuration illustrated in FIG. 5 can be adopted. That is, it is sufficient to provide the latch circuit 33 one for each of the transistors 53 and 54 (=corresponding to the lower switches of the driver portion 50), which are maintained in the on state in the external reset period.

Figure 9:
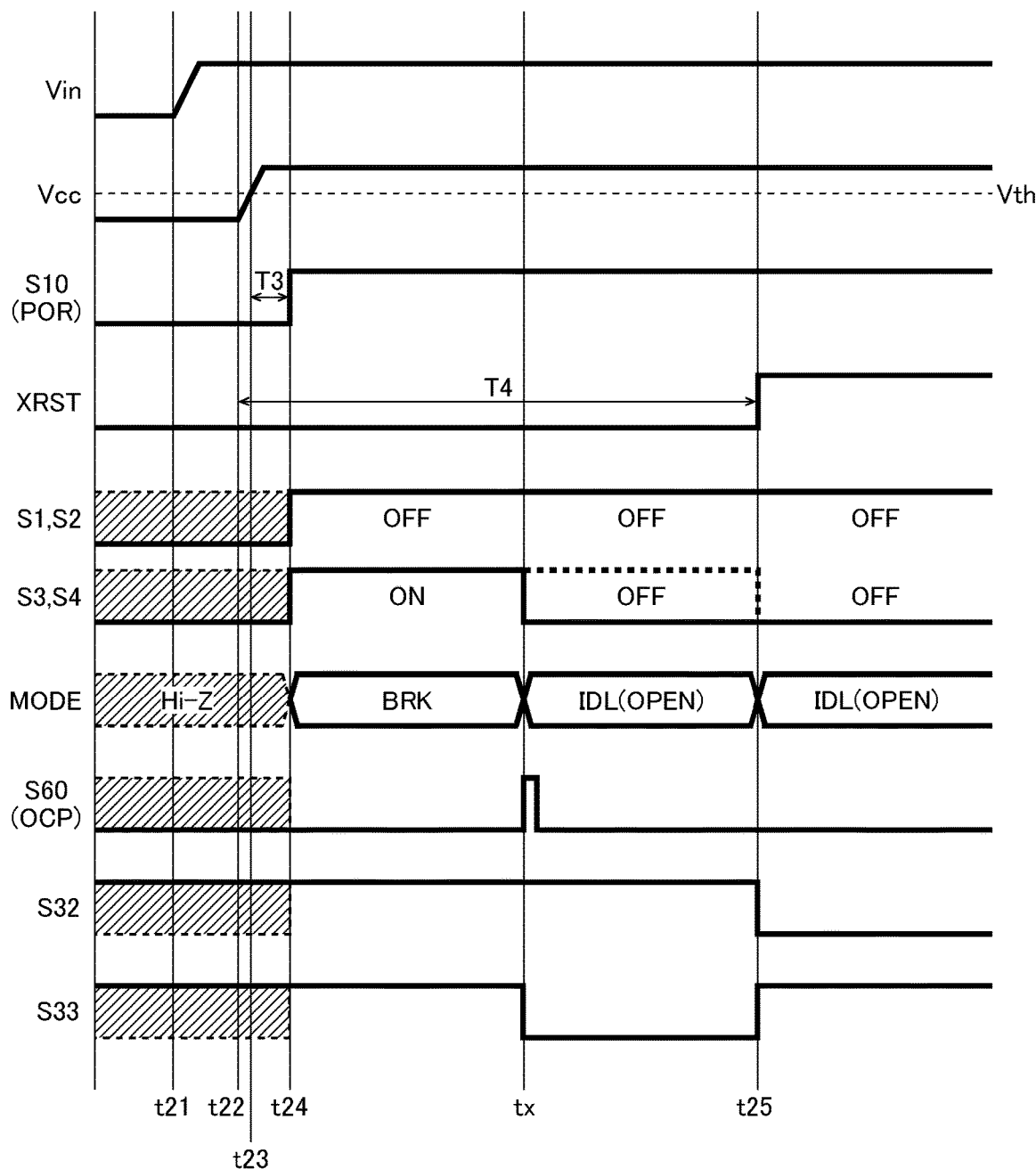
FIG. 9 is a timing chart showing an improved example of the overcurrent protection operation performed at startup.

FIG. 9 is a timing chart showing an improved example of the overcurrent protection operation performed at a startup of the electronic apparatus 100. Depicted in the figure are, from top to bottom, the input voltage Vin, the power supply voltage Vcc, the power on reset signal S10, the external reset signal XRST, the switch signals S1 and S2, the switch signals S3 and S4, the operation mode MODE, the overcurrent detection signal S60, the overcurrent protection signal S32, and the second overcurrent protection signal S33.

Here, the overcurrent protection operation has a lot in common with the overcurrent protection operation illustrated in FIG. 7, and thus the overlapping descriptions will be omitted as much as possible, such that, in the following description, the focus will be on describing an operation of the latch circuit 33, with attention paid to the second overcurrent protection signal S33.

Assume a case where, like in FIG. 7, in the external reset period of the motor driving device 1 (see time tx in FIG. 9), power supply fault abnormality has occurred at the first terminal of the motor 3. In this case, the output current I3 that flows through the transistor 53 is excessive, and thus the overcurrent detection signal S60 rises to high level.

At this time, in the latch circuit 33, the latch signal Sy is raised to high level, with the overcurrent detection signal S60 serving as a latch trigger, and thus the second overcurrent protection signal S33 falls to low level without delay. Accordingly, the switch signal S3 is caused to fall to low level without depending on the logic level of the latch signal SA, and the transistor 53 is forcibly turned off (see the broken line of the switch signal S3). As a result, the current path of the output current I3 is cut off, and thus a further increase of the output current I3 (=overcurrent) is prevented.

Thus, in the latch circuit 33, from when the power is turned on until the external reset is released by the microcomputer 2, the output restriction of the switch signal S3 is performed so as to forcibly turn off the transistor 53, with the overcurrent detection signal S60 serving as a trigger, without waiting for the external reset to be released.

In the latch circuit provided for the transistor 54 as well, the output restriction of the switch signal S4 as described above is performed. Accordingly, after time tx, by forcibly turning off both the transistors 53 and 54, the idle mode is started (see FIG. 2 and FIG. 3D), in which the terminals of the motor 3 are both opened.

Then, when, at time t25, the external reset signal XRST is raised to high level, the D flip-flop 33y of the latch circuit 33 is reset, and thus the second overcurrent protection signal S33 rises to high level, and the overcurrent protection operation by the latch circuit 33 is finished.

On the other hand, when the external reset is released, it becomes possible for the overcurrent protection circuit 32 to start the overcurrent protection. Accordingly, in a case where an overcurrent continues to flow even after time t25, the overcurrent protection circuit 32, instead of the latch circuit 33, performs the output restriction of the switch signal S3 to put the motor 3 into the idle mode. That is, after time t25, the logic portion 30 shifts to a stable state in which the overcurrent protection operation illustrated in FIG. 6 is performed. Here, it is preferable that, in a case where the overcurrent protection operation of the latch circuit 33 has been already started in the external reset period, the overcurrent protection circuit 32 skip counting the mask time T1 and start counting the forced-off time T2 so as to maintain the overcurrent protection state without a break, and that, at a time point when the forced-off time T2 has elapsed since time t25, the overcurrent protection circuit 32 cancel its overcurrent protection operation.

Thus, with the logic portion 30 of the present embodiment, which is capable of starting the appropriate overcurrent protection even in the external reset period immediately after the power is turned on, it is possible to prevent destruction of the motor driving device 1, abnormal heat generation in the motor driving device 1, etc., to thereby enhance the safety of the electronic apparatus 100.

<Application to Vehicle>

Figure 10:
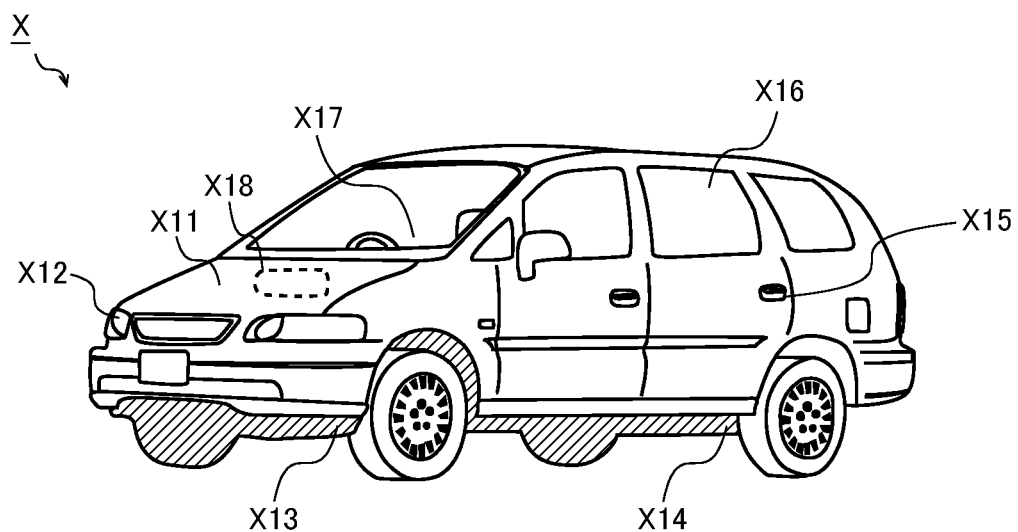
FIG. 10 is an external view of a vehicle, showing a configuration example of the vehicle.

FIG. 10 is an external view of a vehicle X, illustrating a configuration example thereof. The vehicle X of the present configuration example has mounted therein various electronic apparatuses X11 to X18, which operate with a power supply voltage Vcc supplied from a battery (not shown). Here, for convenience of illustration, mounting positions of the electronic apparatuses X11 to X18 in FIG. 10 may be different from their actual mounting positions.

The electronic apparatus X11 is an engine control unit which performs engine-related control (injection control, electronic throttle control, idling control, oxygen sensor heater control, auto cruise control, etc.).

The electronic apparatus X12 is a lamp control unit which controls turning on/off of an HID (high intensity discharged lamp), a DRL (daytime running lamp), etc.

The electronic apparatus X13 is a transmission control unit which performs transmission-related control.

The electronic apparatus X14 is a body control unit which performs control related to motion of the vehicle X (ABS (anti-lock brake system) control, EPS (electric power steering) control, electronic suspension control, etc.).

The electronic apparatus X15 is a security control unit which controls driving of a door lock, a security alarm, etc.

The electronic apparatus X16 is an electronic apparatus installed in the vehicle X before shipping from the factory as standard equipment or a factory-installed option, such as an air conditioner, a wiper, an electric door mirror, a power window, a damper (a shock absorber), an electric sunroof, an electric seat, etc.

The electronic apparatus X17 is an electronic apparatus optionally installed in the vehicle X as a user-installed option, such as an in-vehicle A/V (audio/visual) instrument, a car navigation system, an ETC (automatic tall collection) system, etc.

The electronic apparatus X18 is an electronic apparatus that includes a high-withstanding-voltage motor, such as an in-vehicle blower, an oil pump, a water pump, a battery cooling fan, etc.

Note that the motor driving device 1 described above can be installed in any of the electronic apparatuses X11 to X18.

Other Modified Examples

The above description has dealt with, as an example, a motor driving device that drives a single-phase DC motor, but this is not meant to limit the application target of the present invention, and the present invention is widely applicable also to motor driving devices for driving motors of other types, and further, to load driving devices for driving loads other than motors (in particular, load driving devices incorporated in applications where a switch element needs to be in the on state in the reset period).

Furthermore, in addition to the above embodiments, it is possible to add various modifications to the various technical features disclosed herein without departing from the spirit of the technological creation. In other words, it should be understood that the above embodiments are examples in all respects and are not limiting; the technological scope of the present invention is not indicated by the above description of the embodiments but by the claims; and all modifications within the scope of the claims and the meaning equivalent to the claims are covered.

INDUSTRIAL APPLICABILITY

The invention disclosed herein is applicable to a motor driving device incorporated in an in-vehicle air conditioner, for example.

LIST OF REFERENCE SIGNS 1 motor driving device (load driving device)
2 microcomputer
3 motor
4 power supply device
10 power on reset portion
20 oscillation portion
30 logic portion
31 switch signal generation circuit
31A D flip-flop
31B, 31C AND gate
32 overcurrent protection circuit
32a first timer
32b AND gate
32c second timer
32d RS flip-flop
33 latch circuit
33x inverter
33y D flip-flop
33z NAND gate
40 pre-driver portion
41 to 44 pre-driver
50 driver portion
51 to 54 transistor (switch element)
60 overcurrent detection portion
61 to 64 detection circuit
61a to 64a comparator
61b to 64b voltage supply
61c to 64c transistor (switch element)
61d to 64d resistor
65 OR gate
100 electronic apparatus
X vehicle
X11 to X18 electronic apparatus

The invention claimed is:

1. A load driving device, comprising:
a driver portion including a switch element connected to a load;
a logic portion configured to turn on/off the switch element; and
an overcurrent detection portion configured to monitor a current flowing through the switch element and generate an overcurrent detection signal,
wherein
the logic portion includes
a switch signal generation circuit configured to generate a switch signal so as to maintain the switch element in an on state by default from when power is turned on until an external reset is released by a microcomputer,
an overcurrent protection circuit configured to perform output restriction of the switch signal so as to forcibly turn off the switch element in response to the overcurrent detection signal after the external reset is released, and
a latch circuit configured to perform output restriction of the switch signal so as to forcibly turn off the switch element with the overcurrent detection signal serving as a latch trigger from when the power is turned on until the external reset is released by the microcomputer.

2. The load driving device according to claim 1, wherein
the latch circuit includes
a D flip-flop
whose data terminal is fixed to a logic level at a latch-output time,
whose clock terminal receives the overcurrent detection signal,
whose reset terminal receives an external reset signal from the microcomputer, and
whose output terminal outputs a latch signal, and
a logic gate configured to fix the switch signal to a logic level at a switch-off time when the external reset signal is at a logic level at a reset time and also the latch signal is at a logic level at the latch-output time.

3. The load driving device according to claim 1, wherein
the overcurrent protection circuit is configured to start output restriction of the switch signal when the overcurrent detection signal has been maintained, over a predetermined mask time, at a logic level at a time when an overcurrent is being detected.

4. The load driving device according to claim 1, wherein when a predetermined forced-off time has elapsed since a start of the output restriction of the switch signal, the overcurrent protection circuit releases the output restriction of the switch signal.

5. The load driving device according to claim 1, wherein the driver portion is configured in an H-bridge arrangement including, as the switch element,
- a first upper switch element and a first lower switch element which are connected to a first terminal of the load, and
- a second upper switch element and a second lower switch element which are connected to a second terminal of the load, and from when the power is turned on until the external reset is released by the microcomputer, the logic portion maintains both the first upper switch element and the second upper switch element in an off state, and maintains both the first lower switch element and the second lower switch element in an on state.

6. The load driving device according to claim 5, wherein, from when the power is turned on until the external reset is released by the microcomputer, the latch circuit performs the output restriction of the switch signal so as to forcibly turn off the first lower switch element and the second lower switch element with the overcurrent detection signal serving as a latch trigger.

7. The load driving device according to claim 5, wherein the overcurrent detection portion comprises a plurality of detection circuits each configured to monitor a current flowing through a corresponding one of the first upper switch element, the second upper switch element, the first lower switch element, and the second lower switch element.

8. An electronic apparatus comprising:
a load;
the load driving device according to claim 1, the load driving device being configured to drive the load; and
a microcomputer configured to feed an external reset signal to the load driving device.

9. The electronic apparatus according to claim 8, wherein the load is a motor.

10. A vehicle comprising:
the electronic apparatus according to claim 9; and
a battery configured to supply power to the electronic apparatus.

* * * * *